(12) United States Patent
Xia et al.

(10) Patent No.: US 9,388,494 B2
(45) Date of Patent: Jul. 12, 2016

(54) SUPPRESSION OF PARASITIC DEPOSITION IN A SUBSTRATE PROCESSING SYSTEM BY SUPPRESSING PRECURSOR FLOW AND PLASMA OUTSIDE OF SUBSTRATE REGION

(71) Applicant: Novellus Systems, Inc., San Jose, CA (US)

(72) Inventors: Chunguang Xia, Tualatin, OR (US); Ramesh Chandrasekharan, Portland, OR (US); Douglas Keil, West Linn, OR (US); Edward J. Augustyniak, Tualatin, OR (US); Karl Leeser, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 371 days.

(21) Appl. No.: 13/659,231

(22) Filed: Oct. 24, 2012

(65) Prior Publication Data

US 2013/0344245 A1  Dec. 26, 2013

Related U.S. Application Data

(60) Provisional application No. 61/663,802, filed on Jun. 25, 2012.

(51) Int. Cl.
*C23C 16/44* (2006.01)
*C23C 16/455* (2006.01)
(Continued)

(52) U.S. Cl.
CPC ....... *C23C 16/45519* (2013.01); *C23C 16/4401* (2013.01); *C23C 16/4558* (2013.01); *C23C 16/45502* (2013.01); *C23C 16/45508* (2013.01);
(Continued)

(58) Field of Classification Search
CPC .............. C23C 16/4401; C23C 16/45508; C23C 16/45519–16/45521; C23C 16/45587–16/45591; C23C 16/5096; C23C 16/45525; C23C 16/44502–16/4551; C23C 16/45563–16/4558; H01J 37/3244; H01J 37/32449; H01J 37/32541; H01J 37/32724; H01J 2237/0206; H01J 37/32495; H01J 37/3441; C30B 25/14; C30B 31/16; Y10S 438/935; H01L 21/0228; H01L 2924/0002
USPC .............. 118/715, 723 R, 723 E; 156/345.34, 156/345.43, 345.47
See application file for complete search history.

(56) References Cited

U.S. PATENT DOCUMENTS 2,124,940 A * 7/1938 Zink .............................. 239/104
2,679,821 A * 6/1954 Kuebler ........................ 118/715
(Continued)

OTHER PUBLICATIONS

Terry Day. "The Coanda Effect and Lift. Copyright 2008," pp. 1-017. Source location: http://www.vortex-dynamics.com.au/lift.html. Available: http://www.newfluidtechnology.com.au/wp-content/uploads/THE_COANDA_EFFECT_AND_LIFT.pdf. Accessed: Dec. 12, 2014.*

(Continued)

*Primary Examiner* — Parviz Hassanzadeh
*Assistant Examiner* — Stanislav Antolin

(57) ABSTRACT

A substrate processing system includes a showerhead that comprises a base portion and a stem portion and that delivers precursor gas to a chamber. A collar connects the showerhead to an upper surface of the chamber. The collar includes a plurality of slots, is arranged around the stem portion of the showerhead, and directs purge gas through the plurality of slots into a region between the base portion of the showerhead and the upper surface of the chamber.

16 Claims, 8 Drawing Sheets

(51) Int. Cl.
*C23C 16/509* (2006.01)
*H01J 37/32* (2006.01)

(52) U.S. Cl.
CPC ..... *C23C 16/45565* (2013.01); *C23C 16/45591* (2013.01); *C23C 16/5096* (2013.01); *H01J 37/3244* (2013.01)

(56) References Cited

U.S. PATENT DOCUMENTS

| | | | | |
|---|---|---|---|---|
| 3,621,812 | A * | 11/1971 | Hissong, Jr. et al. | 18/725 |
| 5,399,254 | A * | 3/1995 | Geisler et al. | 204/298.31 |
| 5,580,387 | A * | 12/1996 | Chen | 118/723 MW |
| 5,954,881 | A * | 9/1999 | Burk et al. | 118/715 |
| 6,149,727 | A * | 11/2000 | Yoshioka et al. | 118/730 |
| 6,183,563 | B1 * | 2/2001 | Choi et al. | 118/715 |
| 6,285,010 | B1 * | 9/2001 | Fujikawa et al. | 118/724 |
| 6,289,842 | B1 * | 9/2001 | Tompa | 118/723 E |
| 6,478,872 | B1 * | 11/2002 | Chae et al. | 117/88 |
| 6,849,241 | B2 * | 2/2005 | Dauelsberg et al. | 423/328.2 |
| 2003/0054099 | A1 * | 3/2003 | Jurgensen et al. | 427/248.1 |
| 2003/0070620 | A1 * | 4/2003 | Cooperberg et al. | 118/723 AN |
| 2003/0075273 | A1 * | 4/2003 | Kilpela et al. | 156/345.33 |
| 2003/0077388 | A1 * | 4/2003 | Byun | 427/255.28 |
| 2004/0168769 | A1 * | 9/2004 | Matsuoka et al. | 156/345.33 |
| 2005/0263484 | A1 * | 12/2005 | Park et al. | 156/345.3 |
| 2006/0090705 | A1 * | 5/2006 | Kim | 118/715 |
| 2006/0130756 | A1 * | 6/2006 | Liang et al. | 118/715 |
| 2006/0196420 | A1 * | 9/2006 | Ushakov et al. | 118/715 |
| 2006/0263522 | A1 * | 11/2006 | Byun | 427/248.1 |
| 2007/0293043 | A1 * | 12/2007 | Singh et al. | 438/689 |
| 2009/0095219 | A1 * | 4/2009 | Meinhold et al. | 118/708 |
| 2009/0095220 | A1 * | 4/2009 | Meinhold et al. | 118/712 |
| 2009/0159424 | A1 * | 6/2009 | Liu et al. | 204/164 |
| 2010/0055342 | A1 | 3/2010 | Chiang et al. | |
| 2010/0288728 | A1 * | 11/2010 | Han et al. | 216/41 |
| 2011/0198417 | A1 * | 8/2011 | Detmar et al. | 239/569 |
| 2011/0253044 | A1 | 10/2011 | Tam et al. | |

OTHER PUBLICATIONS

Search Report and Written Opinion corresponding to Singapore Application No. 201304839-2 dated Nov. 4, 2014, 12 pages.

* cited by examiner

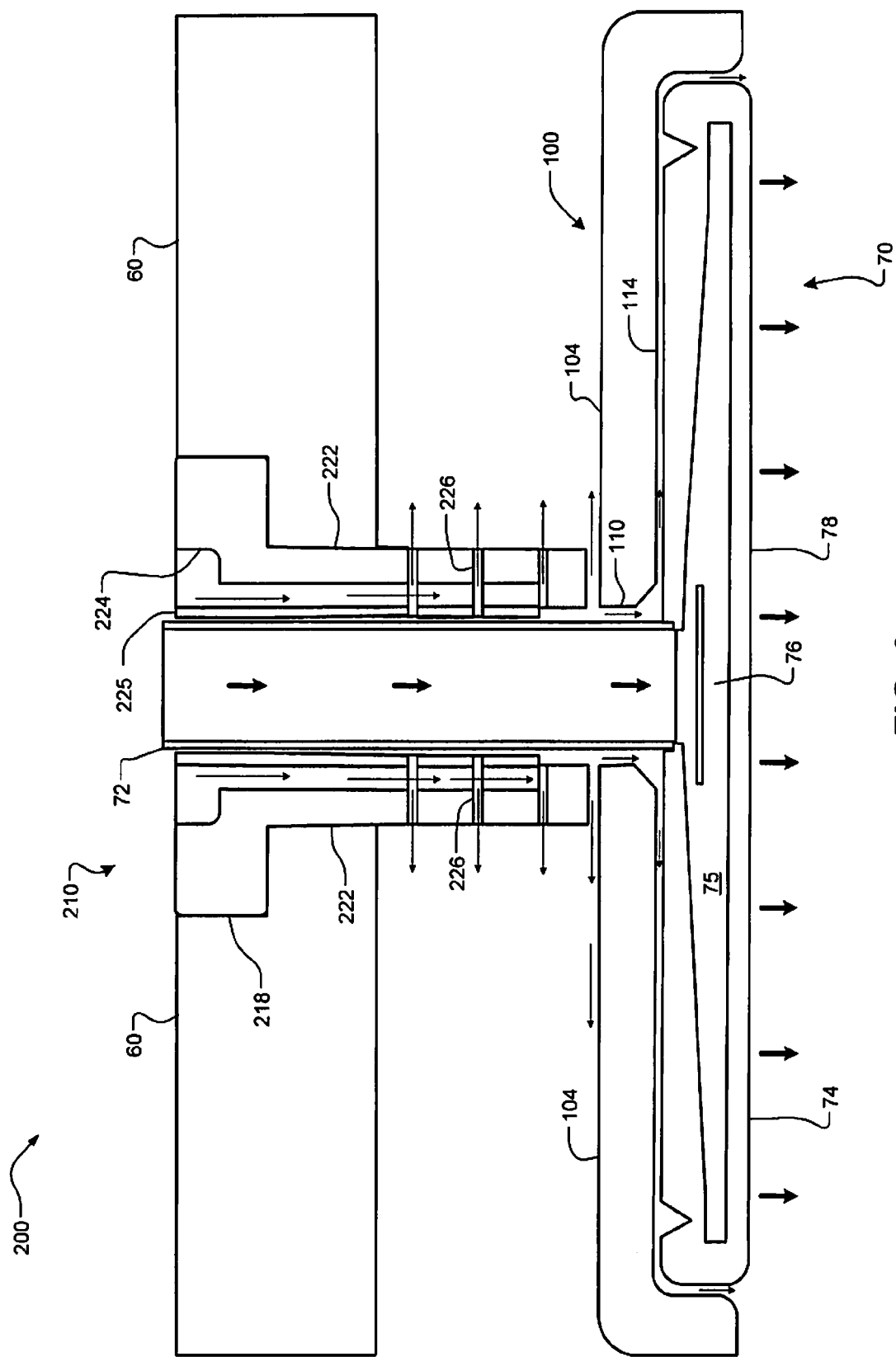

SUPPRESSION OF PARASITIC DEPOSITION IN A SUBSTRATE PROCESSING SYSTEM BY SUPPRESSING PRECURSOR FLOW AND PLASMA OUTSIDE OF SUBSTRATE REGION

CROSS-REFERENCE TO RELATED APPLICATIONS

This application claims the benefit of U.S. Provisional Application No. 61/663,802, filed on Jun. 25, 2012. The disclosure of the above application is incorporated herein by reference in its entirety.

FIELD

The present disclosure relates to substrate processing systems, and more specifically to suppression of parasitic deposition in a substrate processing system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems such as plasma-enhanced atomic layer deposition (PEALD) and plasma-enhanced chemical vapor deposition (PECVD) may be used to deposit and etch films on substrates such as semiconductor wafers. Some PEALD and PECVD systems include chandelier-type showerheads that supply precursor to a processing chamber.

The showerheads typically include a stem portion that extends into the processing chamber and a head portion connected to the stem portion. A cavity is formed behind the head portion between the head portion and an upper surface of the processing chamber. In other words, the showerhead creates dead volume in the cavity.

For continuum processes like PECVD, the cavity is not functionally a problem. However, for transient processes such as conformal film deposition (CFD) or ALD, the cavity stores chemistry that is emptied or exchanged in subsequent steps. Storage of the chemistry across the successive steps may result in time-varying contamination of the ambient. Reducing the cavity tends to bring the showerhead (which is usually powered with RF) closer to a top surface of the chamber (which is usually at ground). This can increase RF coupling to the chamber top surface. In some cases, the increased RF coupling can adversely impact the ability to strike plasma. Also the presence of stagnant chemistry in the cavity area can lead to deposition of films that eventually cause defects.

SUMMARY

A substrate processing system includes a showerhead that comprises a base portion and a stem portion and that delivers precursor gas to a chamber. A collar connects the showerhead to an upper surface of the chamber. The collar includes a plurality of slots, is arranged around the stem portion of the showerhead, and directs purge gas through the plurality of slots into a region between the base portion of the showerhead and the upper surface of the chamber.

In other features, the collar includes a base portion and a stem portion. The stem portion of the collar defines an inner cavity that receives the stem portion of the showerhead. A plate includes an opening that receives the stem portion of the showerhead. The plate is arranged between a lower edge of the stem portion of the collar and the base portion of the showerhead. The collar directs the purge gas between the plate and the stem portion of the showerhead and between the plate and the base portion of the showerhead.

In other features, one surface of the plate includes a plurality of first projections to provide uniform spacing between the plate and the base portion of the showerhead. The opening includes a plurality of second projections to provide uniform spacing between the plate and the stem portion of the showerhead.

In other features, the collar includes first passages arranged in the base portion of the collar. The collar includes second passages defined between a surface of the inner cavity of the stem portion of the collar and the stem portion of the showerhead. The purge gas flows through the first passages to the second passages and from the second passages through the slots.

In other features, the stem portion of the collar has a circular cross section. First passages are arranged in the base portion of the collar. Second passages are arranged in the stem portion of the collar. The purge gas flows through the first passages to the second passages and from the second passages through the slots.

In other features, N dielectric plates are arranged around the stem portion of the showerhead between the base portion of the showerhead and the upper surface of the chamber. The collar directs the purge gas at least one of above and below the N dielectric plates and between the N dielectric plates, where N is an integer greater than zero.

In other features, the cavity defines a plurality of first surfaces that are arranged in a spaced apart relationship around a first circumference and a plurality of arcuate surfaces that are arranged between the plurality of first surfaces. The plurality of arcuate surfaces curve radially outwardly relative to the plurality of first surfaces.

A method for operating a substrate processing system includes delivering precursor gas to a chamber using a showerhead, wherein the showerhead includes a base portion and a stem portion; connecting the showerhead to an upper surface of the chamber using a collar, wherein the collar is arranged around the stem portion of the showerhead; and supplying purge gas through slots of the collar into a region between the base portion of the showerhead and the upper surface of the chamber.

In other features, the collar includes a base portion and a stem portion. The stem portion of the collar defines an inner cavity that receives the stem portion of the showerhead. The method includes positioning a plate, including an opening that receives the stem portion of the showerhead, between a lower edge of the stem portion of the collar and the base portion of the showerhead.

In other features, the method includes directing the purge gas between the plate and the stem portion of the showerhead and between the plate and the base portion of the showerhead. The method includes spacing the plate relative to the base portion and the stem portion of the showerhead using a plurality of projections. The method includes providing first passages in the base portion of the collar and second passages between an inner surface of the cavity of the stem portion of the collar and the stem portion of the showerhead. The method includes flowing the purge gas through the first passages to the second passages and from the second passages through the slots.

In other features, the stem portion of the collar has a circular cross section. The method includes providing first passages in the base portion of the collar and second passages in the stem portion of the collar; and flowing the purge gas through the first passages to the second passages and from the second passages through the slots.

In other features, the method includes arranging N dielectric plates around the stem portion of the showerhead between the base portion of the showerhead and the surface of the chamber and directing the purge gas using the collar at least one of above and below the N dielectric plates and between the N dielectric plates, where N is an integer greater than zero. The substrate processing chamber performs atomic layer deposition.

A method includes arranging a substrate in a chamber of a substrate processing system below a showerhead that is attached to an upper surface of the substrate processing system using a collar; exposing the substrate to a first precursor for a first predetermined period; flowing purge gas through a primary purge path and a secondary purge path after the first predetermined period. The primary purge path flows the purge gas through the showerhead. The secondary purge path flows the purge gas through slots of the collar and between a base portion of the showerhead and the upper surface. The secondary purge path removes the first precursor. The method includes exposing the substrate to a second precursor for a second predetermined period.

In other features, the method includes flowing the purge gas through the primary purge path and the secondary purge path after the second predetermined period. The secondary purge path removes the second precursor between the base portion of the showerhead and the upper surface of the chamber. The method includes flowing the purge gas through the secondary purge path during the first predetermined period. The method includes flowing the purge gas through the secondary purge path during the second predetermined period.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6 is a cross-sectional view of another example of a processing chamber with a showerhead and a secondary purge flow path according to the present disclosure;

DETAILED DESCRIPTION

Figure 1:
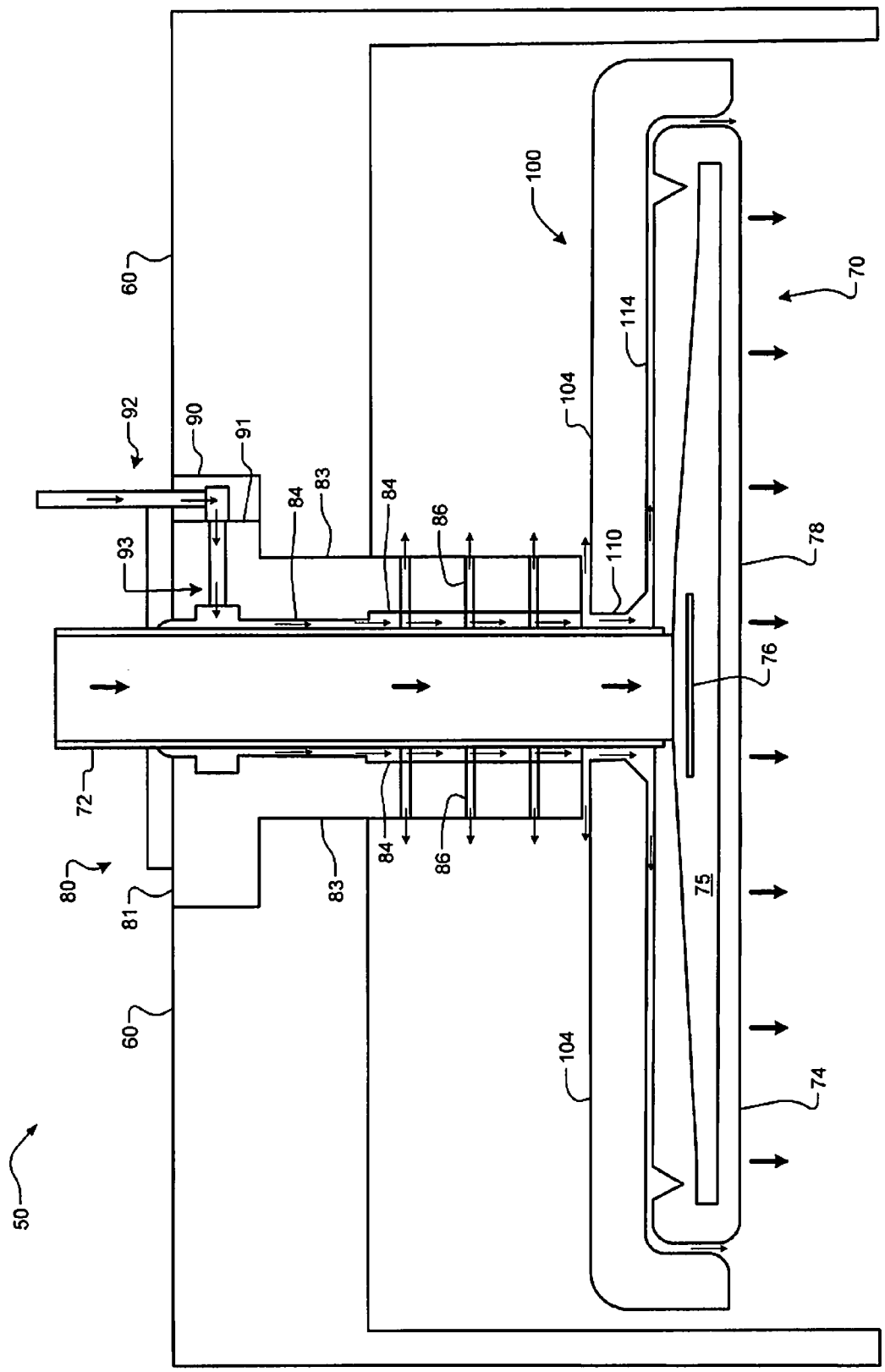
FIG. 1 is a cross-sectional view of an example of a processing chamber with a showerhead and primary and secondary purge flow paths according to the present disclosure.

The present disclosure describes systems and methods for removing excess precursor from a process chamber and preventing the precursor from flowing into specific areas such as the cavity behind the showerhead. The present disclosure also builds up chamber pressure using an inert gas instead of expensive film precursor. The higher chamber pressure acts as an air curtain for the precursor and thus increases the partial pressure of precursor in the substrate region while reducing pressure elsewhere. The higher chamber pressure lowers the chance of parasitic plasma due to the higher pressure regime.

The present disclosure introduces an axisymmetric inert gas flow from a backside of the showerhead. In some examples, the flow of purge gas in the cavity satisfies a Peclet condition (typically a Peclet number greater than one) to prevent back diffusion (or flow) of precursor into the cavity. As a result, chamber volume can be reduced while minimizing unwanted deposition in the cavity, which can be hard to clean. Further improvement may be accomplished by combining the backside flow with RF isolation/suppression devices. The RF isolation/suppression devices may reduce electric fields in the cavity, which reduces the chance of parasitic plasma.

In PEALD processes, the precursor needs to be alternatively present in the reaction chamber and then evacuated. To prevent parasitic deposition, the excess precursor in the processing chamber is removed from the processing chamber and the shared precursor pathways (such as the stem of the showerhead) before introducing the next precursor. The removal of excess precursor is usually done by purging the delivery pathway and chamber with inert gas.

When using a chandelier-type showerhead, the purge gas from the showerhead is not able to effectively remove the excess precursor trapped behind the showerhead. Therefore, the precursor can cause an appreciable amount of parasitic deposition on a back side of the showerhead, the top plate, and the processing chamber wall. It is not possible to fill the dead space with solid dielectric since that approach would likely cause RF coupling problems to ground.

In some examples, the cavity may be partially filled with ceramic and/or a series of spaced, stacked disks. The stacked disks behave as a string of capacitors connected in series. When the spaced, stacked disks are used, there is a net reduction in capacitance (as compared to the capacitance of each of the individual disks). The reduced capacitance also reduces RF coupled to the chamber walls. In some examples, the spacing of the disks is selected to prevent plasma formation between the disks. Gas flow between the disks is desirable to prevent neutral precursors from diffusing into these spaces and then depositing (parasitic deposition).

According to the present disclosure, a secondary purge is used to prevent the parasitic deposition without impacting the tool through-put and film quality. Also, the secondary purge system does not introduce dead volumes in and of itself that act as difficult to clean areas.

Referring now to FIG. 1, an example of a substrate processing system 50 including a processing chamber 60 having a showerhead 70 is shown. The showerhead 70 includes a stem portion 72 and a head portion 74. The head portion 74 defines an inner cavity 75. Fluids such as precursor or purge gas flow through the stem portion 72, onto a dispersion plate

76 and into the inner cavity 75. The fluids then pass through spaced holes 78 in a bottom surface of the head portion 74 and into the processing chamber.

The stem portion 72 of the showerhead 70 is connected to a top wall of the processing chamber 60 by a collar 80. The collar 80 has a generally "T"-shaped cross section and includes a head portion 81 and a stem portion 83. The collar 80 defines an inner cavity 84 that is cylinder-shaped and that receives the stem portion 72 of the showerhead 70. A plurality of slots 86 are formed in the stem portion 83 to allow fluid such as purge gas to flow from the inner cavity 84 to an outer surface of the stem portion 83.

A fluid connector 90 may be connected to an edge 91 of the head portion 81 of the collar 80 and is used to supply fluid such as purge gas. The fluid connector 90 includes one or more conduits and/or connectors that are generally identified at 92. The head portion 81 of the collar 80 likewise includes conduits and/or connectors that are generally identified at 93 to direct the flow of fluid to the inner cavity 84 of the collar 80.

A plate 100 is arranged between the head portion 74 of the showerhead 70 and the collar 80. The plate 100 includes an upper surface 104, a centering opening or bore 110, and a bottom surface 114. In some examples, the plate 100 is made of ceramic. A thickness of the plate 100 may be selected to minimize material and capacitive coupling to ground or parasitic plasma. The upper surface 104 of the plate 100 is spaced from a bottom edge of the collar 80 to allow fluid to pass there between. The centering bore 110 is also spaced from the stem portion 72 to allow fluid to pass there between. The bottom surface 114 of the plate is spaced from the upper surface of the showerhead 70 to allow fluid to flow there between. In some examples, the plate 100 may be omitted and the processing chamber may be operated without the plate 100.

Flowing the purge gas through the collar inhibits process deposition chemistry from entering areas in the cavity to prevent unwanted film deposition there. Dimensions of the slots and other gaps may be selected to prevent plasma light-up therein and to allow for a Peclet condition to be satisfied to prevent back diffusion for the desired gas flow rates.

Figure 2:
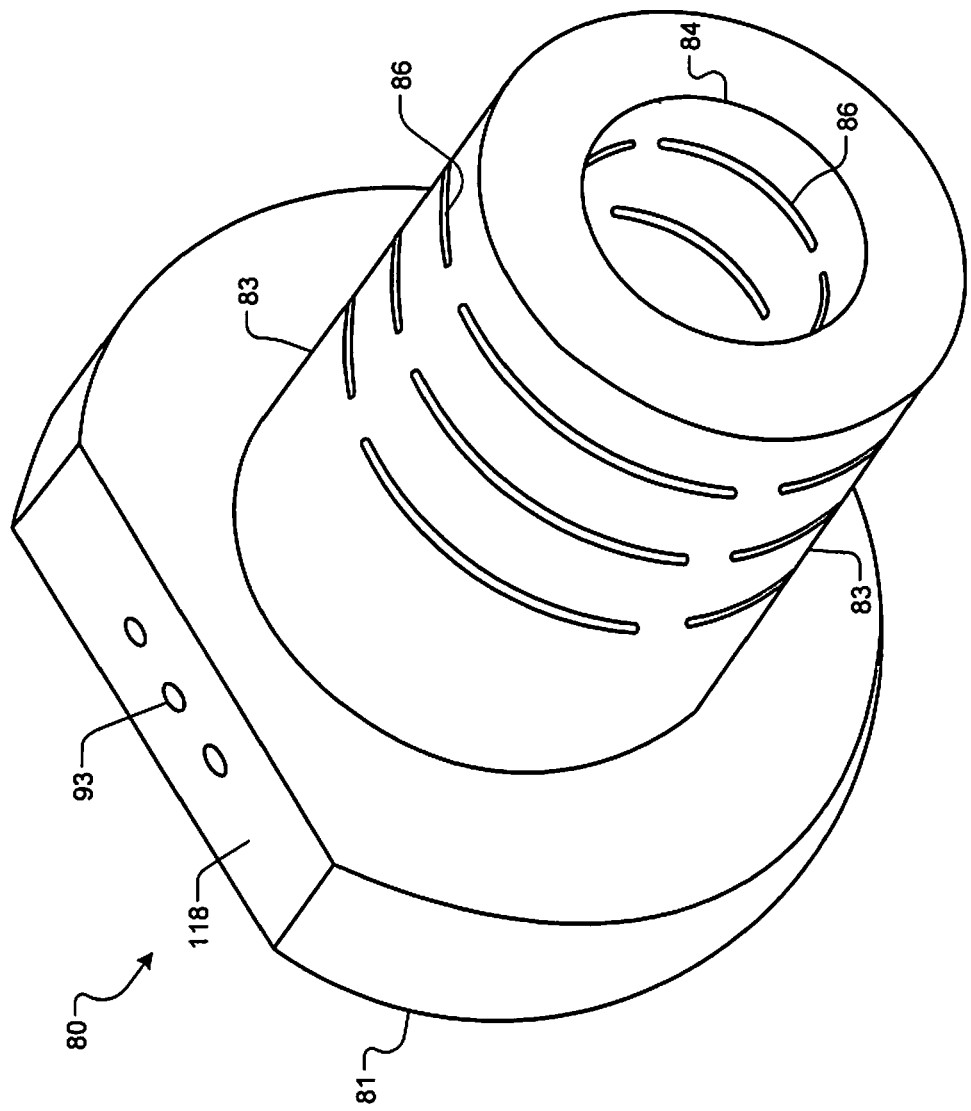
FIG. 2 is a perspective view of an example of a collar according to the present disclosure.

Referring now to FIG. 2, an example of the collar 80 is shown. The collar 80 includes the head portion 81 and the stem portion 83. The slots 86 may have an arcuate shape and may be arranged around the stem portion 83. The slots 86 allow fluid to flow from the inner cavity 84 through the slots 86. The head portion 81 may include a mating portion 118 that mates with a corresponding mating portion on the fluid connector 90. When connected, the conduit 93 of the collar 80 is aligned with the conduit 92 of the fluid connector 90.

Figure 3:
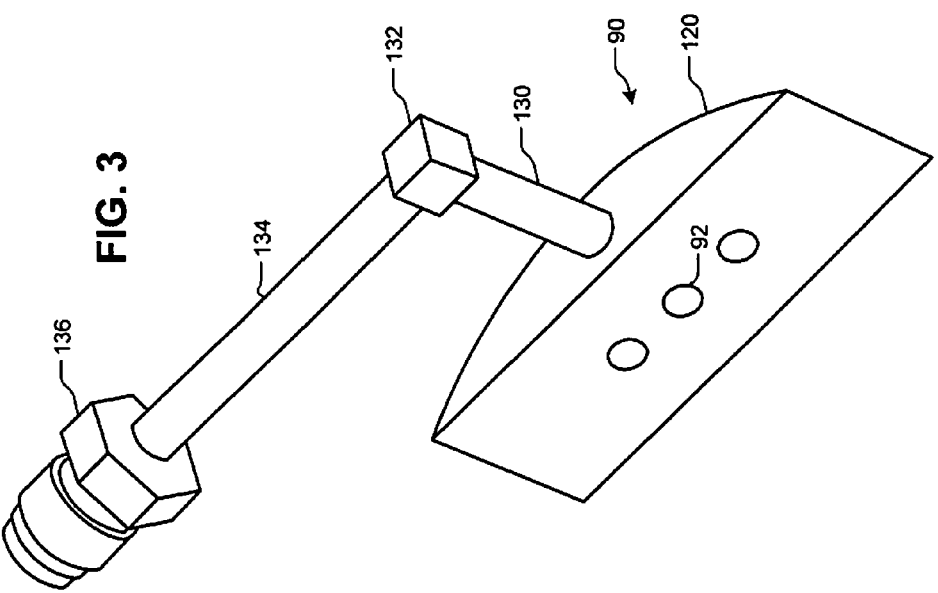
FIG. 3 is a perspective view of a fluid connector for the collar in FIG. 2 according to the present disclosure.

Referring now to FIG. 3, an example of the fluid connector 90 for the collar 80 is shown. While the fluid connector 90 is shown to include a second mating portion 120, a conduit 130, a connector 132, a conduit 134, and a connector 136, other configurations of the fluid connector are contemplated.

Figure 4A:
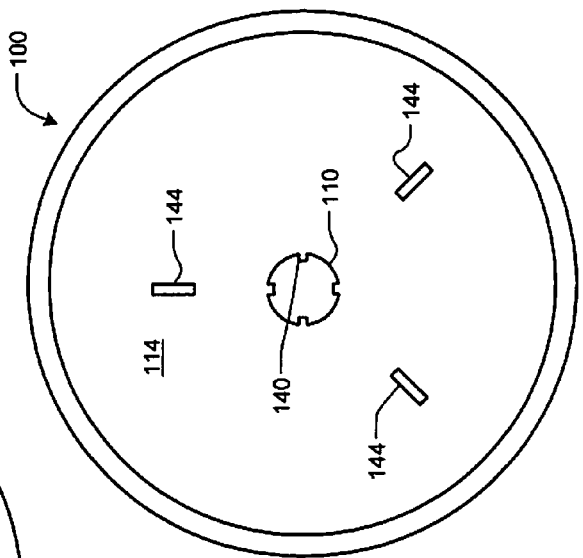
FIGS. 4A and 4B are top and bottom plan views of examples of plates according to the present disclosure.
Figure 4B:
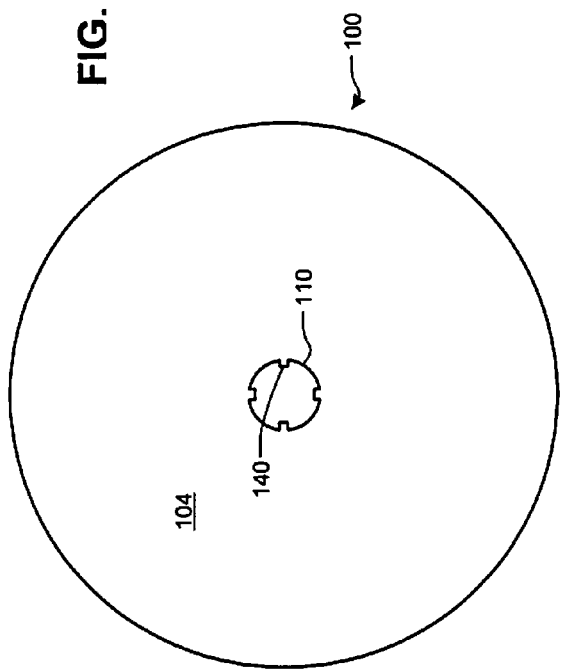

Referring now to FIGS. 4A and 4B, examples of the plate 100 is shown. In FIG. 4A, the upper surface 104 of the plate 100 is shown to have a generally circular cross-section and a centering bore 110 arranged at a center of the plate 100. The centering bore 110 includes one or more projections 140 that extend radially inwardly from the centering bore 110. The projections 140 provide uniform spacing between the plate 100 and the stem portion 72. In FIG. 4B, the bottom surface 114 of the plate 100 is shown to include projections 144 that extend downwardly relative to a top of the processing chamber. The projections 144 provide uniform spacing between the bottom surface 114 of the plate 100 and the upper surface of the head portion 74 of the showerhead 70. The projections 140 and 144 may provide spacing that is sufficiently close to prevent parasitic plasma. For example only, spacing of approximately 3 mm or less may be suitable to prevent parasitic plasma for typical process conditions. Using this spacing for typical process conditions, there is insufficient space for plasma to form along with plasma sheaths (less than two plasma sheath lengths). Formation of plasma may be affected by plasma density, plasma electron temperature, and voltage across the sheath.

Figure 5:
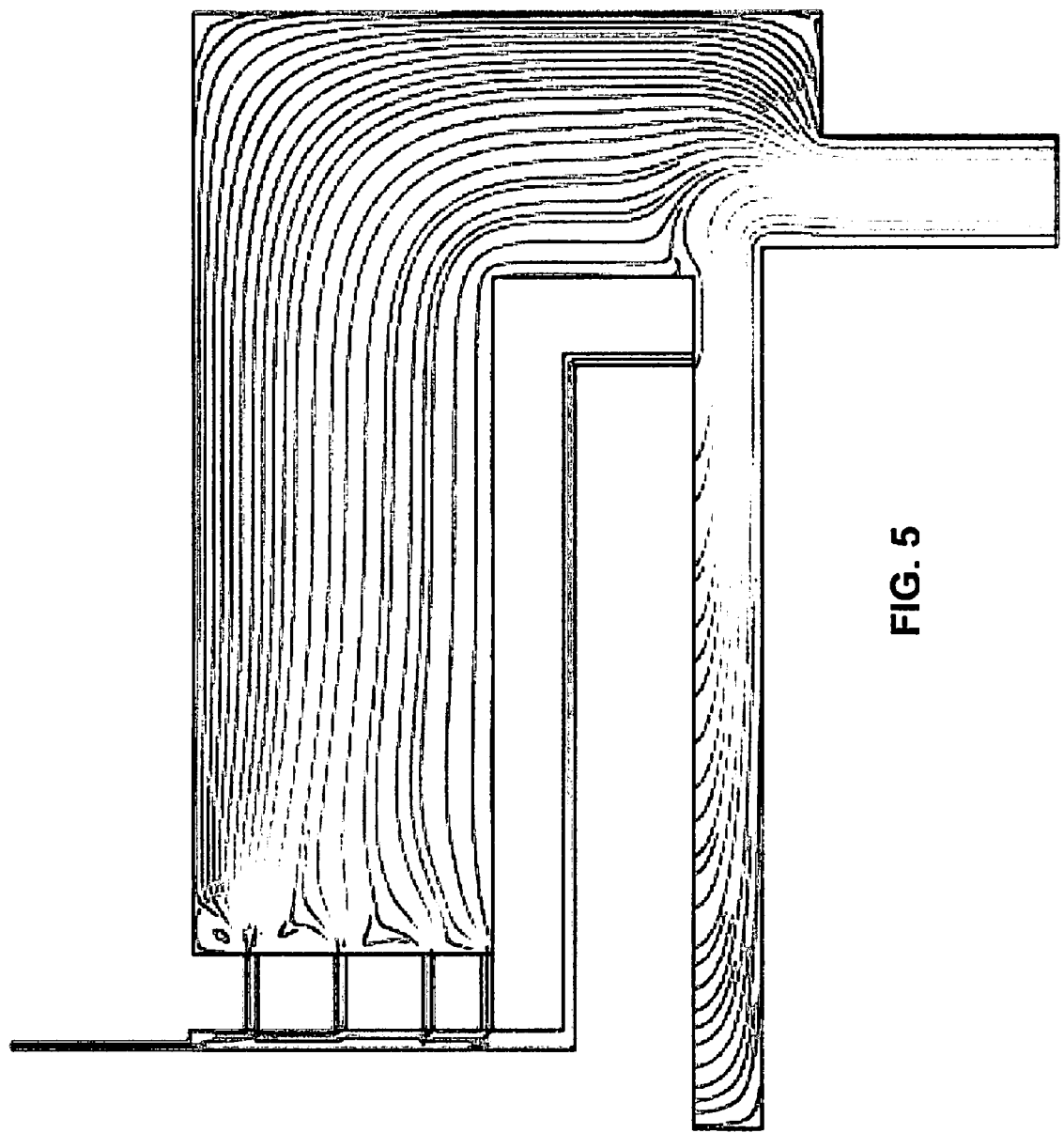
FIG. 5 is a flow model for the processing chamber in FIG. 1 according to the present disclosure.

Referring now to FIG. 5, a flow model for the processing chamber in FIG. 1 is shown. The flow model demonstrates that fluid such as purge gas flows without recirculation near the edge of the showerhead.

Referring now to FIG. 6, another example of a processing chamber 200 is shown. The stem portion 72 of the showerhead 70 is connected to a top wall of the processing chamber 60 by a collar 210. The collar 210 has a generally "T"-shaped cross section and includes a head portion 218 and a stem portion 222. The collar 210 defines a cavity 224 that is spaced from the stem portion 72 of the showerhead 70 by an inner wall 225 of the collar 210. Passageways 227 are connected to the cavity 224. A plurality of slots 226 are formed in the stem portion 222 to allow fluid such as purge gas to flow from the cavity 224 through the passageways 227 to an outer surface of the stem portion 222.

Dimensions of the slots, passageways and other gaps may be selected to have small enough geometries to prevent plasma light-up therein and to allow for a Peclet condition to be satisfied to prevent back diffusion for the desired gas flow rates.

Figure 7:
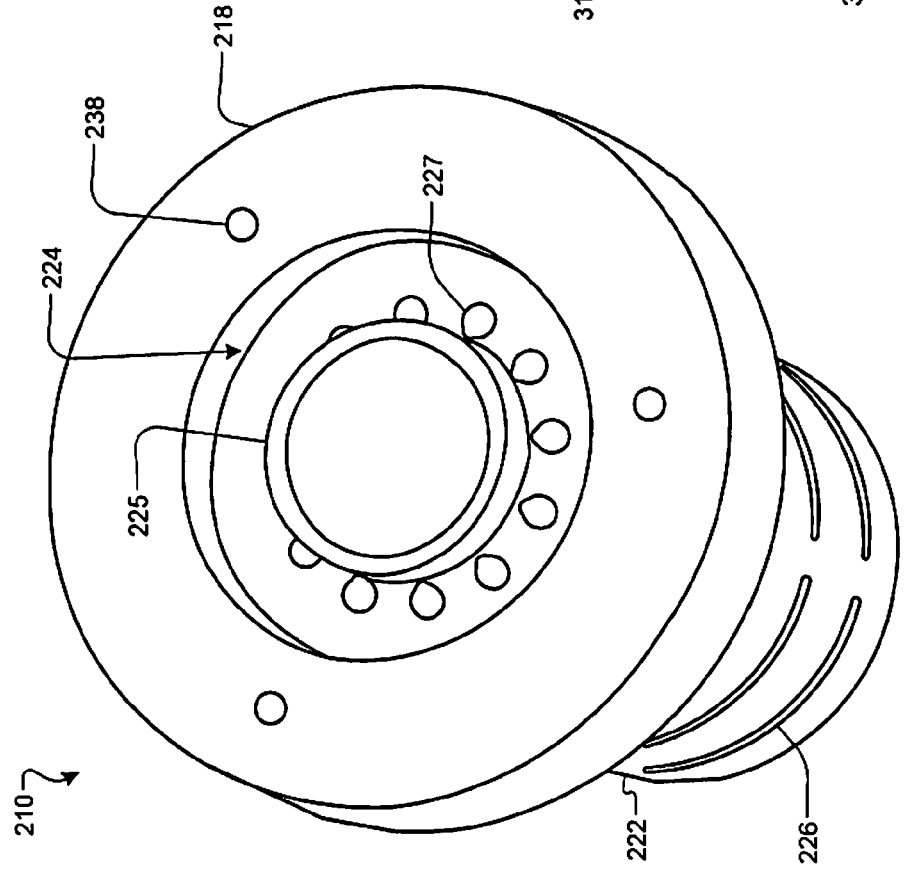
FIG. 7 is a perspective view of another example of a collar according to the present disclosure.

Referring now to FIG. 7, an example of the collar 210 is shown. The cavity 224 is connected to the passageways 227 that are located between the inner wall 225 and an outer wall of the stem portion 222. The passageways 227 are in fluid communication with the slots 226 to allow fluid to flow from the cavity 224 through the passageways 227 to the slots 226. One or more bores 238 may be provided to allow connections to be made to the collar 210. The collar 210 has more symmetric purge flow when the stem portion 72 is not coaxial with the collar 210. The collar 210 is therefore less sensitive to showerhead leveling.

Figure 8:
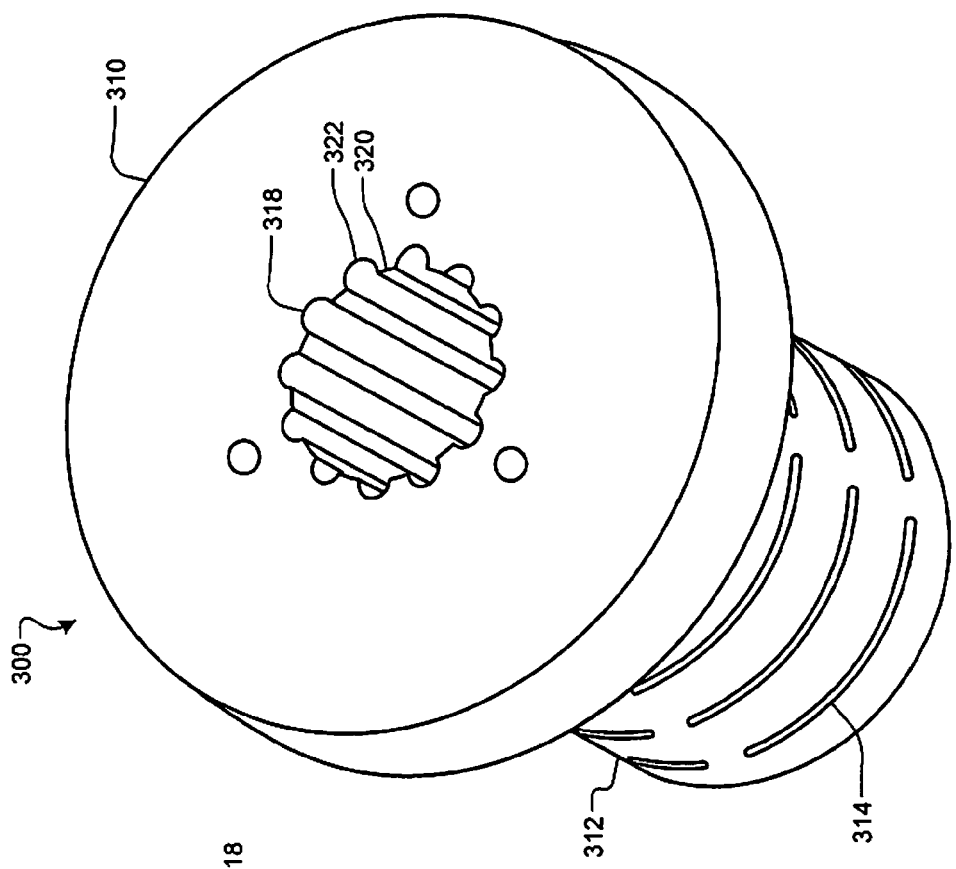
FIG. 8 is a perspective view of another example of a collar according to the present disclosure.

Referring now to FIG. 8, another example of a collar 300 is shown. The collar 300 includes a head portion 310 and a stem portion 312 including a plurality of slots 314. A central cavity 318 receives the stem portion 72 of the showerhead 70. The central cavity 318 includes a first plurality of surfaces 320 arranged substantially along a circle having a first diameter. A plurality of arcuate surfaces 322 curve radially outwardly and are interspersed between the first plurality of surfaces 322 to provide more area to receive fluid.

Figure 9:
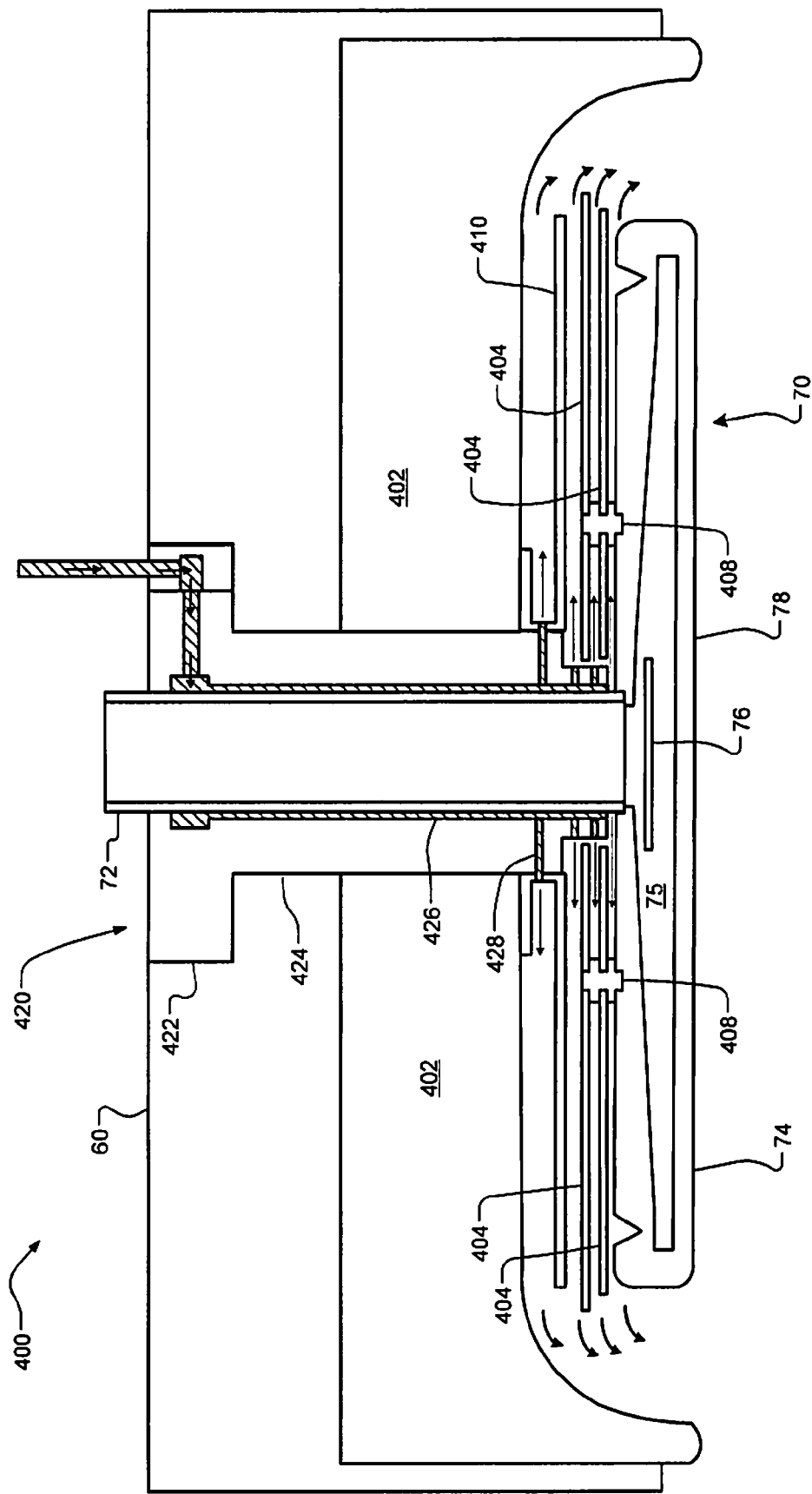
FIG. 9 is a cross-sectional view of still another example of a processing chamber with a showerhead and a secondary purge flow path according to the present disclosure.

Referring now to FIG. 9, another example of a processing chamber 400 is shown. Part of a cavity between an upper surface of the processing chamber 60 and the head portion of the showerhead is filled with a material 402 to reduce processing volume. One or more plates 404 are arranged around the stem portion 72 and above the head portion 74 of the showerhead 70. The plates may be made of a dielectric material.

Since the RF fields in the dielectric stack are still very high, plasma formation (plasma light-up) may occur between the plates 404. In some examples, a gap between the plates 404 is selected such that it is sufficiently small to prevent formation of "bulk" plasma. Spacers 408 can be used to provide uniform spacing above an upper surface of the head portion 74. Another plate 410 may be arranged in the cavity. The plate 410 may be made of a conducting or a dielectric material, may be connected to the upper surface of the processing chamber 60 and may extend generally parallel to the plates 404.

For example only when the gaps are less than or equal to about 3 mm, formation of plasma is prevented for pressures and power levels that are typically used. However, the size of the gaps may be set to other values for a different number of plates, different pressures and/or RF power levels. The size of the gaps and the number of dielectric layers or plates may be selected to prevent plasma formation between the dielectric layers during the semiconductor process for the selected species and selected process conditions such as temperature, pressure and RF power and frequency.

A collar 420 includes a head portion 422 and a stem portion 424 including a plurality of slots 428. A central cavity 426 receives the stem portion 72 of the showerhead 70 and provides additional space for fluid to flow. Fluid flows in the central cavity 426, through the slots 428 and between the plates 404 and 410. The plates 404 suppress plasma and also lower the chance of plasma being sustained in various locations between the plates, collars etc.

Figure 11:
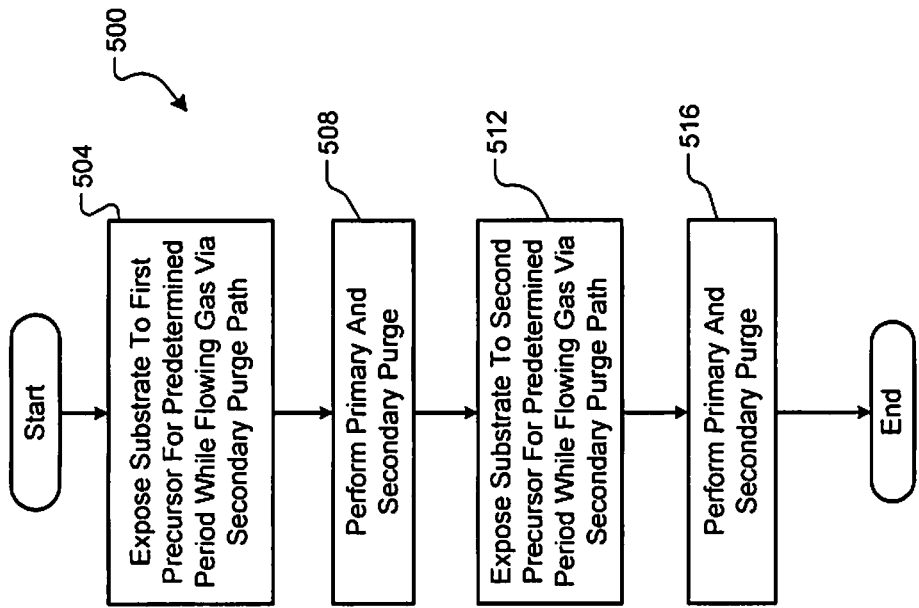
FIGS. 10 and 11 are flowcharts illustrating examples of methods using a secondary purge system according to the present disclosure.
Figure 10:
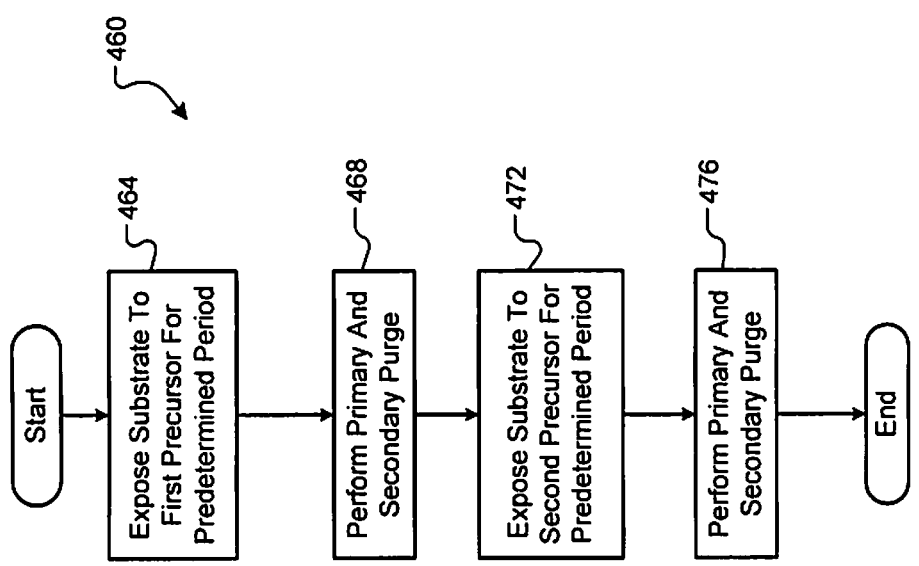

Referring now to FIGS. 10 and 11, flowcharts illustrating examples of methods using a secondary purge are shown. In FIG. 10, a first method 460 is shown. At 464, a substrate is exposed to a first precursor for a first predetermined period. At 468, when the first predetermined period ends, primary and secondary purges are performed. When the primary and secondary purges are complete, the substrate is exposed to a second precursor for a second predetermined period at 472. At 476, when the second predetermined period ends, primary and secondary purges may be performed. Additional processing may be performed as needed.

In FIG. 11, a method 500 that is similar to the method 460 is shown. However, the secondary fluid flow path is also operated during one or both of the precursor exposures. As can be appreciated, the secondary purge can also be operated only during one or both precursor exposures. At 504, a substrate is exposed to a first precursor for a first predetermined period while fluid flows through the secondary purge path. At 508, when the first predetermined period ends, primary and secondary purges are performed. When the primary and secondary purges are complete, the substrate is exposed to a second precursor for a second predetermined period while fluid flows through the secondary purge path at 512. At 516, when the second predetermined period ends, primary and secondary purges may be performed. Additional processing may be performed as needed.

Systems and methods according to the present disclosure use a combination of RF elements and flow elements to attack parasitic deposition in a multi-pronged manner. Systems and methods according to the present disclosure also provide near symmetric flow without creating additional parasitic plasma around the collar. Systems and methods according to the present disclosure do not have a negative impact on film throughput and non-uniformity.

Combined with a plasma suppression kit, systems and methods according to the present disclosure reduce the effective chamber volume, which provides substantial reduction in precursor consumption, which reduces operating cost and purge time. The ceramic plates help to lower the chance of generation of plasma and also lower the chance of plasma being sustained in various locations between the plates, collars etc. For example in FIG. 9, the space between the plate 100 and the top plate is filled with plates that suppress plasma.

Systems and methods according to the present disclosure also eliminate time-varying contamination of the ambient and elimination of chemical reactions behind the showerhead.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A substrate processing system, comprising:
   a showerhead that comprises a head portion and a stem portion and that delivers precursor gas to a chamber,
   wherein the head portion includes an upper surface, a sidewall, a lower planar surface including a plurality of holes, and a cylindrical cavity defined therebetween,
   wherein the head portion extends radially outwardly from one end of the stem portion towards sidewalls of the chamber and defines a cavity between the upper surface of the head portion and an upper surface of the chamber,
   wherein the cylindrical cavity of the head portion receives process gas via the stem portion,
   wherein the process gas in the cylindrical cavity flows though the plurality of holes in the lower planar surface and is distributed into the chamber; and
   a collar that connects the showerhead to the upper surface of the chamber adjacent to an opposite end of the stem portion,
   wherein the collar includes a base portion, a stem portion and a plurality of slots, is arranged around the stem portion of the showerhead, and directs purge gas through the plurality of slots into the cavity between the head portion of the showerhead and the upper surface of the chamber and a first plate that includes an opening that receives the stem portion of the showerhead,
   wherein the first plate is arranged between (i) a lower edge of the stem portion of the collar, below the plurality of slots and (ii) the head portion of the showerhead.

2. The substrate processing system of claim 1, wherein:
   the stem portion of the collar defines an inner cavity that receives the stem portion of the showerhead.

3. The substrate processing system of claim 2, wherein:
   the collar includes first passages arranged in the base portion of the collar;
   the collar includes second passages defined between a surface of the inner cavity of the stem portion of the collar and the stem portion of the showerhead; and
   the purge gas flows through the first passages to the second passages and from the second passages through the slots.

4. The substrate processing system of claim 2, wherein the stem portion of the collar has a circular cross section.

5. The substrate processing system of claim 2, wherein:
   the collar includes first passages arranged in the base portion of the collar;
   the collar includes second passages arranged in the stem portion of the collar; and
   the purge gas flows through the first passages to the second passages and from the second passages through the slots.

6. The substrate processing system of claim 2, wherein the cavity defines:
   a plurality of first surfaces that are arranged in a spaced apart relationship around a first circumference; and
   a plurality of arcuate surfaces that are arranged between the plurality of first surfaces, where the plurality of arcuate surfaces curve radially outwardly relative to the plurality of first surfaces.

7. The substrate processing system of claim 1, wherein the collar directs the purge gas between the first plate and the stem portion of the showerhead and between the first plate and the head portion of the showerhead.

8. The substrate processing system of claim 1, wherein one surface of the first plate includes a plurality of first projections to provide uniform spacing between the first plate and the head portion of the showerhead, and wherein the opening includes a plurality of second projections to provide uniform spacing between the first plate and the stem portion of the showerhead.

9. The substrate processing system of claim 1, further comprising:
N dielectric plates including the first plate, the N dielectric plates arranged around the stem portion of the showerhead between the head portion of the showerhead and the upper surface of the chamber,
wherein the collar directs the purge gas at least one of:
above and below the N dielectric plates; and
between the N dielectric plates,
where N is an integer greater than zero.

10. An atomic layer deposition system comprising the substrate processing system of claim 1.

11. The substrate processing system of claim 1, wherein the showerhead is powered by an RF signal to generate plasma in the chamber.

12. The substrate processing system of claim 1, wherein the chamber is grounded.

13. The substrate processing system of claim 1, wherein the cylindrical cavity has a diameter that is greater than a diameter of the stem portion.

14. The substrate processing system of claim 1, wherein the showerhead includes a chandelier showerhead.

15. The substrate processing system of claim 1, wherein the first plate is arranged such that the purge gas is directed from the plurality of slots across an upper surface of the first plate.

16. The substrate processing system of claim 15, wherein the collar directs the purge gas downward into the opening of the first plate and into a gap between a lower surface of the first plate and an upper surface of the head portion of the showerhead.

* * * * *